(12) United States Patent
Jin et al.

(10) Patent No.: US 12,022,674 B2
(45) Date of Patent: Jun. 25, 2024

(54) DISPLAY PANEL AND METHOD FOR PRODUCING SAME, AND DISPLAY DEVICE

(71) Applicant: KunShan Go-Visionox Opto-Electronics Co., Ltd., Jiangsu (CN)

(72) Inventors: Yu Jin, Jiangsu (CN); Jiaxin Zheng, Jiangsu (CN); Jiapei Ren, Jiangsu (CN); Wei Liu, Jiangsu (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 370 days.

(21) Appl. No.: 17/330,676

(22) Filed: May 26, 2021

(65) Prior Publication Data

US 2021/0280816 A1 Sep. 9, 2021

Related U.S. Application Data

(63) Continuation of application No. PCT/CN2019/119000, filed on Nov. 15, 2019.

(30) Foreign Application Priority Data

May 29, 2019 (CN) .......................... 201910458204.2

(51) Int. Cl.
*H10K 50/00* (2023.01)
*H10K 50/818* (2023.01)
(Continued)

(52) U.S. Cl.
CPC ......... *H10K 50/818* (2023.02); *H10K 71/621* (2023.02); *H10K 59/122* (2023.02); *H10K 2102/103* (2023.02); *H10K 2102/351* (2023.02)

(58) Field of Classification Search
CPC .. H10K 50/818; H10K 71/621; H10K 59/122; H10K 2102/103; H10K 2102/351;
(Continued)

(56) References Cited

U.S. PATENT DOCUMENTS

| | | | |
|---|---|---|---|
| 2005/0067945 A1 | 3/2005 | Nishikawa et al. | |
| 2010/0051973 A1* | 3/2010 | Kobayashi | H10K 50/805 257/E33.068 |

(Continued)

FOREIGN PATENT DOCUMENTS

| | | | |
|---|---|---|---|
| CN | 102668706 A | 9/2012 | |
| CN | 105552249 A | 5/2016 | |

(Continued)

OTHER PUBLICATIONS

EP Search Report dated Dec. 9, 2021 in EP Application No. 19931277.8.

(Continued)

*Primary Examiner* — Mohammad M Hoque
(74) *Attorney, Agent, or Firm* — Rimon PC (57) ABSTRACT

The present disclosure relates to the field of organic light emission, and discloses a display panel and a method for producing same, and a display device. The display panel includes: a substrate; a pixel defining layer disposed on the substrate; and an electrode layer located between the substrate and the pixel defining layer; wherein the pixel defining layer is internally provided with a through hole disposed corresponding to the electrode layer, and the through hole penetrates through the pixel defining layer and falls on the electrode layer; the electrode layer comprises a first transparent conductive layer and a light-shielding conductive layer that are arranged in a stack, and along a stacking direction of the electrode layer, an area of an orthographic projection of the first transparent conductive layer on the (Continued)

substrate is larger than an area of an orthographic projection of the light-shielding conductive layer on the substrate.

16 Claims, 8 Drawing Sheets

(51) Int. Cl.
  *H10K 71/00* (2023.01)
  *H10K 59/122* (2023.01)
  *H10K 102/00* (2023.01)
  *H10K 102/10* (2023.01)

(58) Field of Classification Search
  CPC .. H10K 59/65; H10K 50/814; H10K 59/1201; H10K 59/131
  USPC .......................................................... 257/91
  See application file for complete search history.

(56) References Cited

U.S. PATENT DOCUMENTS

| | | |
|---|---|---|
| 2012/0074439 A1 | 3/2012 | Kho et al. |
| 2015/0102306 A1* | 4/2015 | Shi ...................... H10K 50/818 257/40 |
| 2015/0137097 A1 | 5/2015 | Choi et al. |
| 2016/0233275 A1 | 8/2016 | Toyoda |
| 2016/0365390 A1 | 12/2016 | Hsu et al. |
| 2017/0221974 A1* | 8/2017 | Kimura ................ H10K 50/813 |
| 2018/0047790 A1* | 2/2018 | Chae ...................... H10K 50/86 |
| 2019/0206963 A1* | 7/2019 | Zhang ................ H10K 59/1213 |
| 2020/0044181 A1* | 2/2020 | Shohji ................. H10K 50/818 |

FOREIGN PATENT DOCUMENTS

| | | |
|---|---|---|
| CN | 105655375 A | 6/2016 |
| CN | 106531768 A | 3/2017 |
| CN | 107706209 A | 2/2018 |
| CN | 107706221 A | 2/2018 |
| CN | 109742114 A | 5/2019 |
| CN | 110165079 A | 8/2019 |
| JP | 2005-108736 A | 4/2005 |
| JP | 2008-166258 A | 7/2008 |
| JP | 2010-055919 A | 3/2010 |
| JP | 2014-078536 A | 5/2014 |
| JP | 2015-138612 A | 7/2015 |
| JP | 2015-141775 A | 8/2015 |
| WO | 2011/114576 A1 | 9/2011 |
| WO | 2011114424 A1 | 9/2011 |
| WO | 2018/173465 A1 | 9/2018 |

OTHER PUBLICATIONS

Japanese first office action for application No. 2021-534680 dated Jun. 21, 2022.
PCT International Search Report for International Application No. PCT/CN2019/119000 dated Feb. 26, 2020.
PCT Written opinion for International Application No. PCT/CN2019/119000 dated Feb. 26, 2020.
Chinese First Office Action for CN Application No. 201910458204.2 dated Feb. 24, 2020.
European Office Communication for application No. 19 931 277.8, dated Apr. 5, 2024; 10 total pages.

* cited by examiner

DISPLAY PANEL AND METHOD FOR PRODUCING SAME, AND DISPLAY DEVICE

CROSS REFERENCE TO RELATED APPLICATIONS

This application is a continuation of International Application No. PCT/CN2019/119000 filed on Nov. 15, 2019, which claims priority to Chinese patent application No. 201910458204.2, filed on May 29, 2019. Both applications are incorporated herein by reference in their entireties.

TECHNICAL FIELD

The present disclosure relates to the field of organic light-emitting display, and particularly to a display panel and a method for producing the same, and a display device.

BACKGROUND

With the continuous development of display technology, a display panel is used more and more widely. Organic light emitting diode (OLED) devices have become a rising star in the display panel industry with its advantages of fast response speed, gorgeous color, lightness and convenience. As the display panel integrates functions such as fingerprint recognition under a screen, a light transmittance of the display panel is required to be large enough. In order to increase the light transmittance of the display panel, it is necessary to reduce an area of an opaque electrode.

Then, reducing the area of the opaque electrode easily leads to an abnormal light emission of the display panel.

SUMMARY

Some embodiments of the present disclosure provide a display panel and a method for producing same, and a display device, which can improve a light transmittance while reducing the possibility of an abnormal light emission.

In order to solve the above technical problems, an embodiment of the present disclosure provides a display panel, which includes: a substrate; a pixel defining layer disposed on the substrate; and an electrode layer located between the substrate and the pixel defining layer. The pixel defining layer is internally provided with a through hole disposed opposite to the electrode layer, and the through hole extends through the pixel defining layer and till the electrode layer, that is, the through hole penetrates through the pixel defining layer and falls on the electrode layer, or that is, the through hole penetrates through the pixel defining layer and reaches to the electrode layer. The electrode layer includes a first transparent conductive layer and a light-shielding conductive layer that are arranged in a stack. Along a stacking direction of the electrode layer, an area of an orthographic projection of the first transparent conductive layer on the substrate is larger than an area of an orthographic projection of the light-shielding conductive layer on the substrate.

An embodiment of the present disclosure further provides a display device, which includes the display panel as described above.

An embodiment of the present disclosure further provides a method for producing the display panel, which includes the following steps: providing a substrate; forming an electrode layer on the substrate; and forming a pixel defining layer on the electrode layer, where the pixel defining layer is internally provided with a through hole disposed opposite to the electrode layer, and the through hole penetrates through the pixel defining layer and falls on the electrode layer (that is, the through hole extends through the pixel defining layer and till the electrode layer), where forming the electrode layer on the substrate specifically includes forming a first transparent conductive layer and a light-shielding conductive layer on the substrate by stacking, and along a stacking direction of the electrode layer, an area of an orthographic projection of the first transparent conductive layer on the substrate is larger than an area of an orthographic projection of the light-shielding conductive layer on the substrate.

DETAILED DESCRIPTION

In order to make the objectives, technical solutions and advantages of the present disclosure clearer, the technical solutions in the embodiments of the present disclosure will be clearly and completely described with reference to the accompanying drawings in the present disclosure. It is evident that the embodiments described are only some rather than all embodiments in the present disclosure. Based on the embodiments of the present disclosure, all other embodiments obtained by those of ordinary skills in the art without any creative work shall fall within the protection scope of the present disclosure.

An OLED display device has a problem that after reducing an area of an opaque electrode, it is easy to cause a display panel to emit light abnormally. According to the applicant's research, the reason for this problem is that the OLED display device in the existing technology is usually provided with a through hole on a pixel defining layer. In order to ensure a normal light emission, the through hole in the existing technology needs to fall on the opaque electrode, that is, an edge of a sidewall of the through hole facing the opaque electrode is all located on the opaque electrode. However, with a decrease of the opaque electrode, due to an existence of process errors, the through hole may not completely fall on the electrode, that is, at least part of the edge of the sidewall of the through hole facing the opaque electrode is not located on the opaque electrode, and the problem of abnormal display may occur at this time.

Figure 1A:
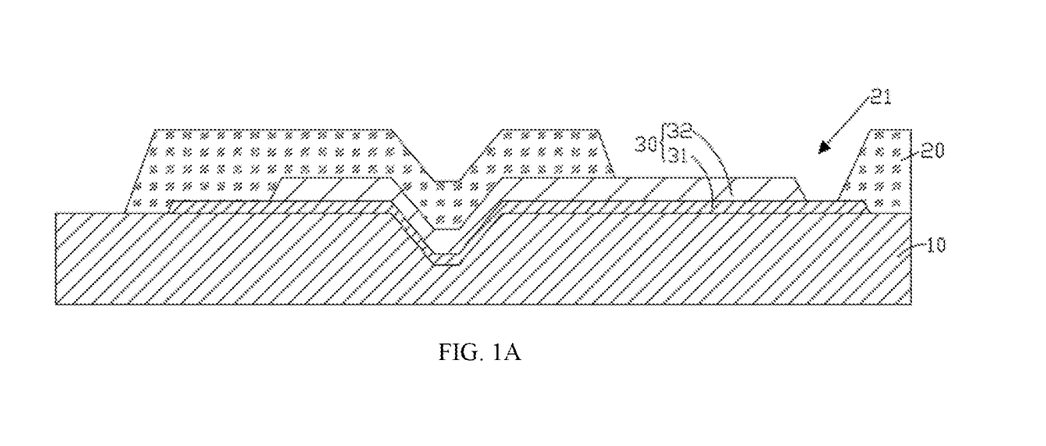
FIG. 1A is a schematic structural diagram of a display panel provided by an embodiment of the present disclosure.

An embodiment of the present disclosure relates to a display panel, as shown in FIG. 1A, including: a substrate 10, a pixel defining layer 20 disposed on the substrate 10, and an electrode layer 30 located between the substrate 10 and the pixel defining layer 20. Herein, the pixel defining layer 20 includes a through hole 21 disposed opposite to the electrode layer 30, and the through hole 21 penetrates through the pixel defining layer 20 and falls on the electrode layer 30, that is, the through hole 21 extends through the pixel defining layer 20 and till the electrode layer 30. The electrode layer 30 includes a first transparent conductive layer 31 and a light-shielding conductive layer 32 that are arranged in a stack. Along a stacking direction of the electrode layer 30, an area of an orthographic projection of the first transparent conductive layer 31 on the substrate is larger than an area of an orthographic projection of the light-shielding conductive layer 32 on the substrate.

The electrode layer 30 is formed by stacking the first transparent conductive layer 31 and the light-shielding conductive layer 32. A light transmittance of the first conductive layer 31 is greater than a light transmittance of the light-shielding layer 32, and along the stacking direction of the electrode layer 30, the area of the orthographic projection of the first transparent conductive layer 31 on the substrate is larger than the area of the orthographic projection of the light-shielding conductive layer 32 on the substrate. Therefore, under the condition of having the same light transmittance (that is, an area of an opaque part is the same) as in the existing technology, the orthographic projection, located on the substrate and along the stacking direction of the electrode layer 30, of the electrode layer 30 in the embodiment of the present disclosure has a larger overall area. The electrode layer 30 with a larger area makes the through hole 21 less likely to fall outside the electrode layer 30 in a case where the through hole 21 is arranged in cooperation with the electrode layer 30, thus reducing the possibility of abnormal light emission in the display panel.

Figure 2:
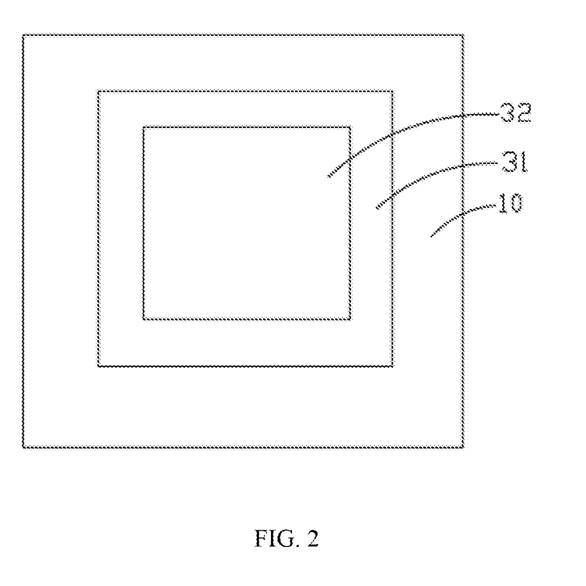
FIG. 2 is a schematic diagram of an orthographic projection of a display panel on a substrate along a stacking direction of a first electrode plate provided by an embodiment of the present disclosure.

As shown in FIG. 2, along the stacking direction of the electrode layer 30, the orthographic projection of the light-shielding conductive layer 32 on the substrate 10 is located inside the orthographic projection of the first transparent conductive layer 31 on the substrate 10. That is, an area where the light-shielding conductive layer 32 is attached with the first transparent conductive layer 31 is at least the area of the orthographic projection of the light-shielding conductive layer 32 on the substrate 10, so that a contact area between the first transparent conductive layer 31 and the light-shielding conductive layer 32 is large, and the first transparent conductive layer 31 may better protect the light-shielding conductive layer 32.

Figure 3:
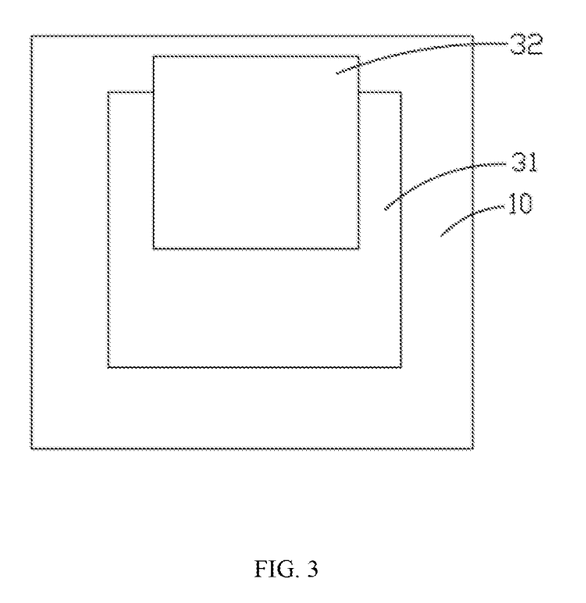
FIG. 3 is a schematic diagram of the orthographic projection of the display panel on the substrate along the stacking direction of the first electrode plate after changing a position of a light-shielding conductive layer in the display panel provided in FIG. 2.

The orthographic projection of the light-shielding conductive layer 32 on the substrate 10 is located inside the orthographic projection of the first transparent conductive layer 31 on the substrate 10, which is only a specific example of an arrangement state of the first transparent conductive layer 31 and the light-shielding conductive layer 32 in this embodiment. As shown in FIG. 3, along the stacking direction of the electrode layer 30, the orthographic projection of the light-shielding conductive layer 32 on the substrate 10 may also partially overlap with the orthographic projection of the first transparent conductive layer 31 on the substrate 10. Along the stacking direction of the electrode layers 30, the orthographic projection of the light-shielding conductive layer 32 on the substrate 10 partially overlaps with the orthographic projection of the first transparent conductive layer 31 on the substrate 10, so that the overall area of the electrode layer 30 is larger than an overall area of the first transparent conductive layer 31, thereby further increasing the overall area of the electrode layer 30 and further reducing the possibility of abnormal light emission.

A material of the first transparent conductive layer 31 is ITO or IZO, and a material of the light-shielding conductive layer 32 is a metal or a graphite, where the metal may be a silver, a lead, etc. The material of the first transparent conductive layer 31 being the ITO or the IZO is only a specific example of the material of the first transparent conductive layer 31 in this embodiment, and does not constitute a limitation. In other embodiments of the present disclosure, the first transparent conductive layer 31 may also be other materials with both transparent and conductive properties, such as ZnO-based TCO, etc., which are not listed here. In addition, the material of the light-shielding conductive layer 32 being the metal or the graphite is only a specific example of the material of the light-shielding conductive layer 32 in this embodiment and does not constitute a limitation. In other embodiments of the present disclosure, the light-shielding conductive layer 32 may also be other materials with both light-shielding and conductive properties, such as an opaque conductive plastic, etc., which are not listed here, but may be flexibly selected according to actual needs.

The first transparent conductive layer 31 is sandwiched between the substrate 10 and the light-shielding conductive layer 32. The light-shielding conductive layer 32 is located on a surface of the first transparent conductive layer 31 away from the substrate 10. Since the light-shielding conductive layer 32 made of the metal and other materials has a poor bonding with the substrate 10, in this embodiment, the first transparent conductive layer 31 made of the ITO or the IZO material is sandwiched between the substrate 10 and the light-shielding conductive layer 32, which may make the bonding between layers in the display panel firmer and improve the reliability of the display panel.

Figure 1B:
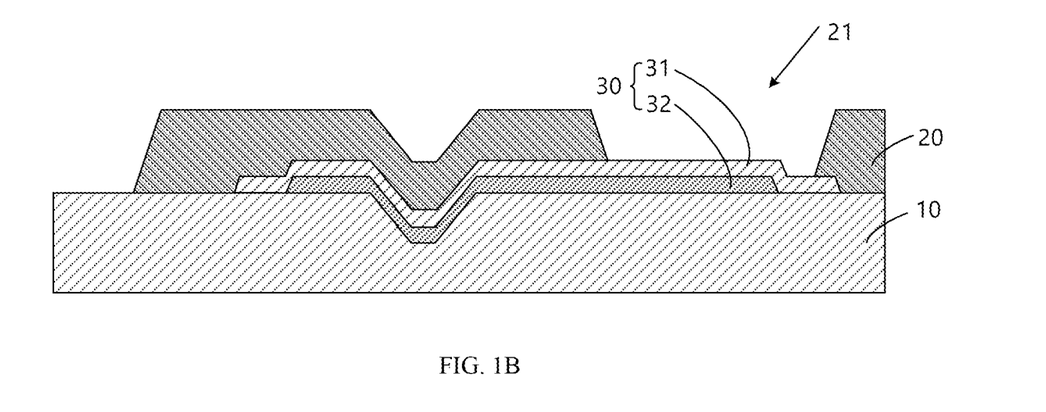
FIG. 1B is a schematic structural diagram of a display panel where a light-shielding conductive layer is sandwiched between a substrate and a first transparent conductive layer.

The above-described sandwiching the first transparent conductive layer 31 between the substrate 10 and the light-shielding conductive layer 32 is only an example of a positional relationship among the first transparent conductive layer 31, the substrate 10 and the light-shielding conductive layer 32 in this embodiment, and does not constitute a limitation. In other embodiments of the present disclosure, as shown in FIG. 1B, the light-shielding conductive layer 32 may also be sandwiched between the substrate 10 and the first transparent conductive layer 31. The light-shielding conductive layer 32 made of the metal or the graphite is sandwiched between the substrate 10 and the first transparent conductive layer 31, so that the first transparent conductive layer 31 may protect the light-shielding conductive layer 32 and prevent the light-shielding conductive layer 32 from being oxidized.

The through hole 21 falls on the electrode layer 30. By setting the through hole 21 to fall on the electrode layer 30, the possibility of abnormal light emission of the display panel may be completely eliminated. In order to prevent the actually produced through hole 21 from falling on a region outside the electrode layer 30 due to a technical error, in a case where designing a positional relationship between the through hole 21 and the electrode layer 30 in this embodiment, an error reserve area is set at an edge of the electrode layer 30 in advance, that is, a part of the electrode layer 30 close to the edge is set as the error reserve area. In a case where designing the positional relationship between the through hole 21 and the electrode layer 30, a position of the through hole 21 is not set to the error reserve area.

The error reserve area is an area with a distance less than 2 μm from the edge of the electrode layer 30. The above is only a specific example of the error reserve area in this embodiment. In other embodiments of the present disclosure, the error reserve area may also be of other sizes, which may be flexibly set according to actual needs.

A sidewall of the through hole 21 at least partially falls on the first transparent conductive layer 31, that is, at least part of an edge of the sidewall of the through hole 21 facing the substrate is located on the first transparent conductive layer 31. The sidewall of the through hole 21 at least partially falling on the first transparent conductive layer 31 is only an example of a specific position in this embodiment, and does not constitute a limitation. In other embodiments of the present disclosure, the sidewall of the through hole 21 may not fall on the first transparent conductive layer 31, but fall on other parts of the electrode layer 30, such as all falling on the light-shielding conductive layer 32, which is not listed here. In this embodiment, the electrode layer 30 is an anode layer.

The substrate 10 sequentially includes a underlay 11, a barrier layer 12 located above the underlay 11, a buffer layer 13 located above the barrier layer 12, a channel 14 located above the buffer layer 13, a first gate insulating layer 15 covering the channel 14, a gate 16 disposed above the first gate insulating layer 15 and a source 17 and a drain 18 penetrating through the first gate insulating layer 15, a second gate insulating layer 19 located above the first gate insulating layer 15 and covering the gate 16, an intermediate insulating layer 10a covering the second gate insulating layer 19, a filling layer 10b covering the intermediate insulating layer 10a, a capacitor lower plate 10c located between the first gate insulating layer 15 and the second gate insulating layer 19, and a capacitor upper plate 10d located between the intermediate insulating layer 10a and the second gate insulating layer 19.

The electrode layer 30 is disposed on the filling layer 10b and electrically connected to the drain 18 through the filling layer 10b.

A material of the filling layer 10b is a polylactic acid. The material of the filling layer 10b being the polylactic acid is only a specific example in this embodiment. In other embodiments of the present disclosure, the filling layer 10b may also be made of other materials, such as a polyethylene, which are not listed here, but may be flexibly set according to actual needs.

Figure 4:
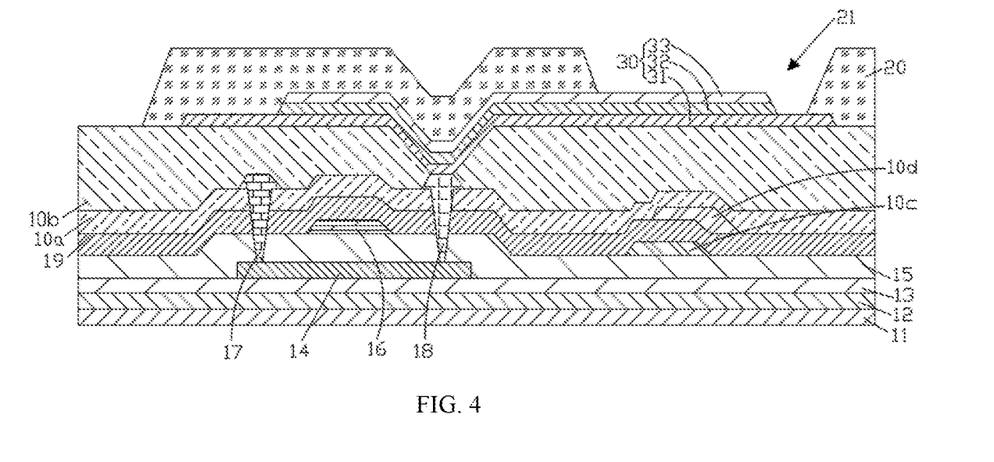
FIG. 4 is a schematic structural diagram of the display panel provided in FIG. 1A after adding a second transparent conductive layer.

An embodiment of the present disclosure also relates to a display panel, which is substantially the same as the previous embodiments and also includes a substrate 10, a pixel defining layer 20 disposed on the substrate 10, and an electrode layer 30 located between the substrate 10 and the pixel defining layer 20. Herein, the pixel defining layer 20 includes a through hole 21 disposed opposite to the electrode layer 30, and the through hole 21 penetrates through the pixel defining layer 20 and falls on the electrode layer 30, that is, the through hole 21 extends through the pixel defining layer 20 and till the electrode layer 30. The main difference is that in this embodiment, as shown in FIG. 4, the electrode layer 30 includes a second transparent conductive layer 33 in addition to a first transparent electrode layer 31 and a light-shielding conductive layer 32. A material of the second transparent conductive layer 33 is ITO or IZO. The material of the second transparent conductive layer 33 being the ITO or the IZO is only a specific example of the material of the second transparent conductive layer 33 in this embodiment, and does not constitute a limitation. In other embodiments of the present disclosure, the second transparent conductive layer 33 may also be other materials with both transparent and conductive properties, such as ZnO-based TCO, which are not listed here.

The first transparent conductive layer 31 is sandwiched between the light-shielding conductive layer 32 and the substrate 10, and the light-shielding conductive layer 32 is sandwiched between the first transparent conductive layer 31 and the second transparent conductive layer 33. The light-shielding conductive layer 32 is located on a surface of the first transparent conductive layer 31 facing the second transparent conductive layer 33, and the light-shielding conductive layer 32 is located on a surface of the second transparent conductive layer 33 facing the first transparent conductive layer 31.

While retaining all the technical effects of the display panel provided by the previous embodiment, the display panel provided by the present embodiment is further provided with the electrode layer 30 including the second transparent conductive layer 33 and the light-shielding conductive layer 32 sandwiched between the first transparent conductive layer 31 and the second transparent conductive layer 33, which may effectively increase a firmness of the combination between various components and improve the reliability of the display panel; and may also protect the light-shielding conductive layer 32 and prevent the light-shielding conductive layer 32 from being oxidized.

A sidewall of the through hole 21 at least partially falls on the first transparent conductive layer 31. The sidewall of the through hole 21 at least partially falling on the first transparent conductive layer 31 is only an example of a specific position in this embodiment, and does not constitute a limitation. In other embodiments of the present disclosure, the sidewall of the through hole 21 may not fall on the first transparent conductive layer 31, but fall on other parts of the electrode layer 30, such as all falling on the second transparent conductive layer 33 or all falling on the light-shielding conductive layer 32, that is, the edge of a sidewall of the through hole 21 facing the substrate 10 is all located on the second transparent conductive layer 33 or the light-shielding conductive layer 32; or the sidewall of the through hole 21 may also at least partially fall on the light-shielding conductive layer 32, that is, at least part of an edge of the sidewall of the through hole 21 facing the substrate 10 is located on the light-shielding conductive layer 32; or the sidewall of the through hole 21 may also at least partially fall on the second transparent conductive layer 33, that is, at least part of an edge of the sidewall of the through hole 21 facing the substrate 10 is located on the second transparent conductive layer 33, which are not listed here.

Figure 5:
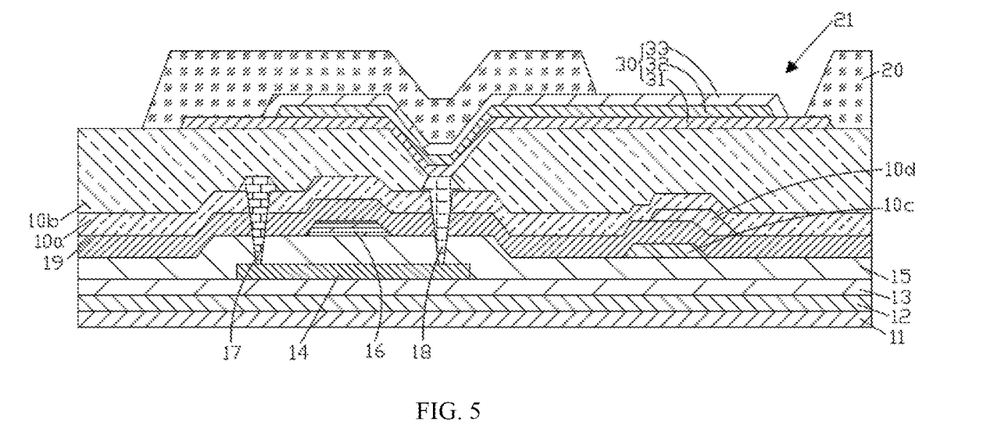
FIG. 5 is a schematic structural diagram of the display panel provided in FIG. 4 after changing a shape of the second transparent conductive layer.
Figure 6:
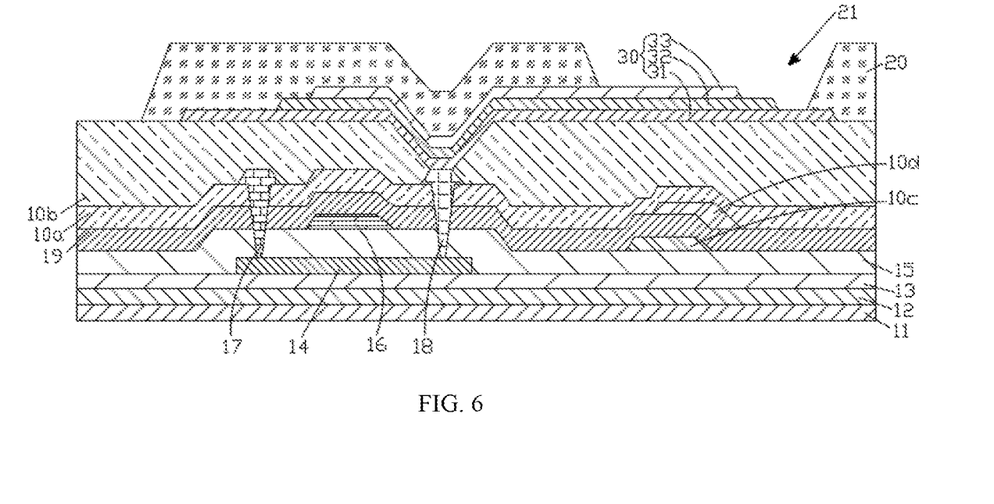
FIG. 6 is a schematic structural diagram of the display panel provided in FIG. 4 after changing a shape of the second transparent conductive layer.
Figure 14:
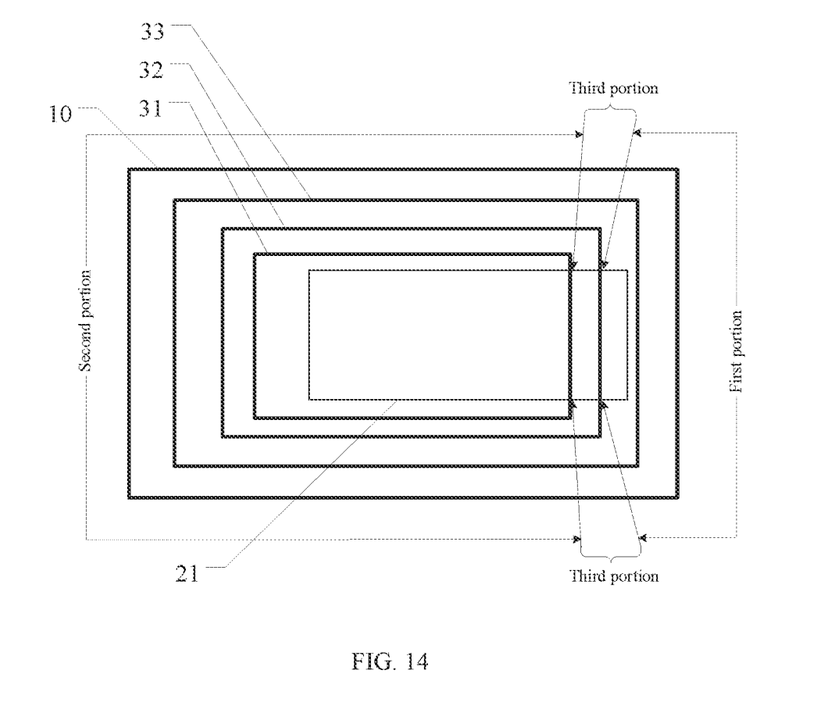
FIG. 14 is a schematic diagram of an orthographic projection of a display panel on a substrate along a stacking direction of a first electrode plate provided by FIG. 6.

An area of the second transparent conductive layer 33 is equal to an area of the light-shielding conductive layer 32 along a stacking direction of the electrode layer 30. The area of the second transparent conductive layer 33 being equal to the area of the light-shielding conductive layer 32 is only a specific application example in this embodiment, which does not constitute a limitation. In other embodiments of the present disclosure, as shown in FIG. 5, the through hole penetrates through the second transparent conductive layer and the light-shielding conductive layer and reaches to the first transparent conductive, the area of the second transparent conductive layer 33 may be larger than the area of the light-shielding conductive layer 32, even if the second transparent conductive layer 33 completely covers an upper surface and a side surface of the light-shielding conductive layer 32. Alternatively, as shown in FIG. 6 and FIG. 14, the through hole penetrates through the second transparent conductive layer and the light-shielding conductive layer and reaches to the first transparent conductive, the area of the second transparent conductive layer 33 may be smaller than the area of light-shielding conductive layer 32, that is, part of the upper surface of the light-shielding conductive layer 32 is exposed.

For example, in at least one embodiment of the present disclosure, as shown in FIG. 4, a lower edge of a first portion of a sidewall of the through hole 21 reaches the first transparent conductive layer 31, a lower edge of a second portion of the sidewall of the through hole 21 reaches the second transparent conductive layer 33, the orthographic projection of the light-shielding conductive layer 32 on the substrate 10 partially overlaps with an orthographic projection of the second transparent conductive layer 33 on the substrate 10, and the orthographic projection of the light-shielding conductive layer 32 on the substrate 10 is located inside the orthographic projection of the first transparent conductive layer 31 on the substrate 10. In the embodiment shown in FIG. 4, the sidewall of the through hole 21 is composed by the first portion and the second portion.

For example, in some embodiments of the present disclosure, as shown in FIG. 4, an orthographic projection, located on the substrate 10, of the first portion is located inside the orthographic projection, located on the substrate 10, of the first transparent conductive layer 31, and an orthographic projection, located on the substrate 10, of the second portion is located inside the orthographic projection, located on the substrate 10, of the second transparent conductive layer 33.

In should be noted that each of the first portion and the second portion of the sidewall of the through hole 21 include the lower edge and an upper edge, as shown in FIG. 4, the lower edge faces the substrate 10, and the upper edge is away from the substrate 10, that is, the lower edge is closer to the substrate 10 than the upper edge.

For example, in at least one embodiment of the present disclosure, as shown in FIG. 5, the lower edge of the first portion of the sidewall of the through hole 21 reaches the first transparent conductive layer 31, a lower edge of a second portion of the sidewall of the through hole 21 reaches the second transparent conductive layer 32, other part of the edge of the sidewall of the through hole 21 facing the substrate 10 is located on first transparent conductive, the second transparent conductive layer 33 completely covers an upper surface of the light-shielding conductive layer 32 facing the second transparent conductive layer 33 and a side surface of the light-shielding conductive layer 32, and the orthographic projection of the light-shielding conductive layer 32 on the substrate 10 is located inside the orthographic projection of the first transparent conductive layer 31 on the substrate 10. In the embodiment shown in FIG. 5, the sidewall of the through hole 21 is composed by the first portion and the second portion.

For example, in some embodiments of the present disclosure, as shown in FIG. 5, an orthographic projection, located on the substrate 10, of the first portion is located inside the orthographic projection, located on the substrate 10, of the first transparent conductive layer 31, and an orthographic projection, located on the substrate 10, of the second portion is located inside the orthographic projection, located on the substrate 10, of the second transparent conductive layer 33.

In should be noted that each of the first portion and the second portion of the sidewall of the through hole 21 include the lower edge and an upper edge, as shown in FIG. 5, the lower edge faces the substrate 10, and the upper edge is away from the substrate 10, that is, the lower edge is closer to the substrate 10 than the upper edge.

For example, in at least one embodiment of the present disclosure, as shown in FIG. 6, the lower edge of the first portion of the sidewall of the through hole 21 reaches the first transparent conductive layer 31, the lower edge of a second portion of the sidewall of the through hole 21 reaches the second transparent conductive layer 33, the edge of the third portion of the sidewall of the through hole 21 is located on the light-shielding conductive layer 32, an orthographic projection of the second transparent conductive layer 33 on the substrate 10 is located inside the orthographic projection of the light-shielding conductive layer 32 on the substrate 10, and the orthographic projection of the light-shielding conductive layer 32 on the substrate 10 is located inside the orthographic projection of the first transparent conductive layer 31 on the substrate 10. In the embodiment shown in FIG. 6, the sidewall of the through hole 21 is composed by the first portion, the second portion and the third portion.

For example, in some embodiments of the present disclosure, as shown in FIG. 6, an orthographic projection, located on the substrate 10, of the first portion is located inside the orthographic projection, located on the substrate 10, of the first transparent conductive layer 31, an orthographic projection, located on the substrate 10, of the second portion is located inside the orthographic projection, located on the substrate 10, of the second transparent conductive layer 33, and an orthographic projection, located on the substrate 10, of the third portion is located inside the orthographic projection, located on the substrate 10, of the light-shielding conductive layer 32.

In should be noted that each of the first portion, the second portion and the third portion of the sidewall of the through hole 21 include the lower edge and an upper edge, as shown in FIG. 6, the lower edge faces the substrate 10, and the upper edge is away from the substrate 10, that is, the lower edge is closer to the substrate 10 than the upper edge.

A thickness of the first transparent conductive layer 31 and a thickness of the second transparent conductive layer 33 are both greater than or equal to 8 nm and less than or equal to 15 nm. The thickness of the first transparent conductive layer 31 and the thicknesses of the second transparent conductive layer 33 may be the same or different.

The thickness of the first transparent conductive layer 31 and the thicknesses of the second transparent conductive layer 33 are both 10 nm.

A thickness of the light-shielding conductive layer 32 is greater than or equal to 80 nm and less than or equal to 120 nm.

The thickness of the light-shielding conductive layer 32 is 100 nm.

An embodiment of the present disclosure relates to a display device, which includes the display panel provided by other embodiments of the present disclosure.

The display device provided by the embodiment of the present disclosure includes the display panel provided by other embodiments of the present disclosure. Therefore, the display device provided by this embodiment has all the technical effects of the display panel provided by other embodiments of the present disclosure, which is not repeated here.

Figure 7:
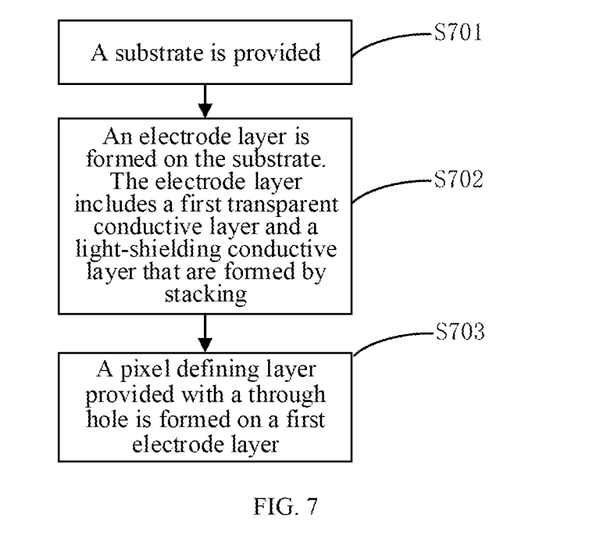
FIG. 7 is a program flow chart of a method for producing a display panel provided by an embodiment of the present disclosure.

An embodiment of the present disclosure relates to a method for producing a display panel, as shown in FIG. 7, which includes the following steps.

In S701, a substrate is provided.

In S702, an electrode layer is formed on the substrate. The electrode layer includes a first transparent conductive layer and a light-shielding conductive layer that are formed by stacking.

The first transparent conductive layer and the light-shielding conductive layer are formed on the substrate by stacking to serve as the electrode layer. A projection area of the first transparent conductive layer is larger than a projection area of the light-shielding conductive layer in a stacking direction of the electrode layer.

In S703, a pixel defining layer is formed on the electrode layer.

The pixel defining layer is internally provided with a through hole disposed opposite to the electrode layer, and the through hole penetrates through the pixel defining layer and falls on the electrode layer. The through hole falls on the electrode layer, that is, side walls of the through hole fall on the electrode layer.

In order to prevent an edge of the actually produced through hole from falling on a region outside the electrode layer due to a technical error, in a case where designing a position of the through hole in this embodiment, a preset position of the through hole is a region away from an edge of the electrode layer by a preset distance.

The preset distance is less than 3 µm. The preset distance is 2 µm. The preset distance being 2 µm is only a specific example in this embodiment, and does not constitute a limitation. In other embodiments of the present disclosure, the preset distance may also be other values, which are not listed here, but may be flexibly set according to actual needs.

This embodiment is an embodiment of the method for producing the display panel corresponding to the embodiments mentioned above, and this embodiment may be implemented in cooperation with the embodiments mentioned above. The relevant technical details mentioned in the above-mentioned embodiments are still valid in this embodiment, and in order to reduce repetition, they will not be repeated here. Correspondingly, the relevant technical details mentioned in this embodiment may also be applied in the above-mentioned embodiments.

The display panel prepared by the method for producing the display panel provided by the embodiment of the present disclosure increases an area of the anode, where a part of the anode with increased area is a transparent ITO or IZO film which has almost no influence on a light transmittance of a screen body, and fundamentally prevents an effect that the pixel defining layer is unable to completely wrap the anode, thereby greatly increasing a process allowance of wrapping the anode with the pixel defining layer, effectively reducing a requirement on an alignment accuracy of the pixel defining layer and the anode, and simplifying the process steps.

Figure 8:
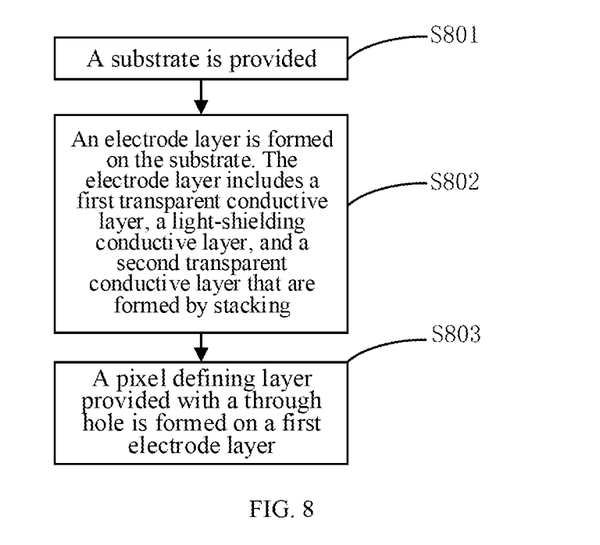
FIG. 8 is a program flow chart of the method for producing the display panel provided in FIG. 7 after adding a second transparent conductive layer.

An embodiment of the present disclosure relates to a method for producing a display panel, as shown in FIG. 8, which includes the following steps.

In S801, a substrate is provided.

In S802, an electrode layer is formed on the substrate. The electrode layer includes a first transparent conductive layer, a light-shielding conductive layer, and a second transparent conductive layer that are formed by stacking.

The electrode layer is formed on the substrate, which specifically includes the following steps.

Figure 9:
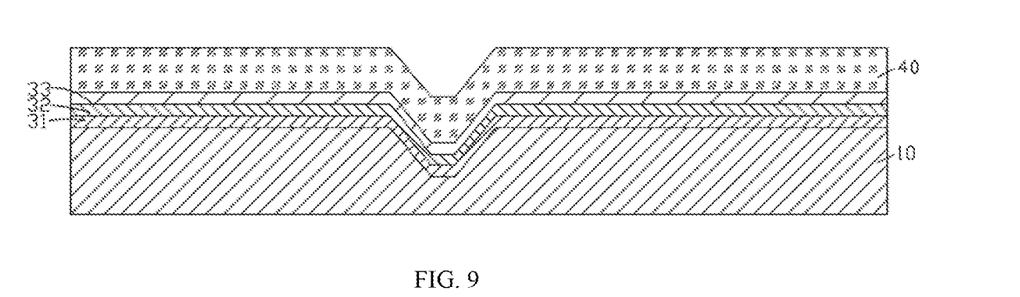
FIGS. 9 to 13 are schematic structural diagrams corresponding to each step in a method for producing a display panel provided by an embodiment of the present disclosure.

As shown in FIG. 9, a first transparent conductive layer 31 is formed on the substrate, a light-shielding conductive layer 32 covering the first transparent conductive layer 31 is formed on the first transparent conductive layer 31, a second transparent conductive layer 33 covering the light-shielding conductive layer 32 is formed on the second transparent conductive layer 33, and a photoresist layer 40 covering the second transparent conductive layer 33 is formed on the second transparent conductive layer 33.

Figure 10:
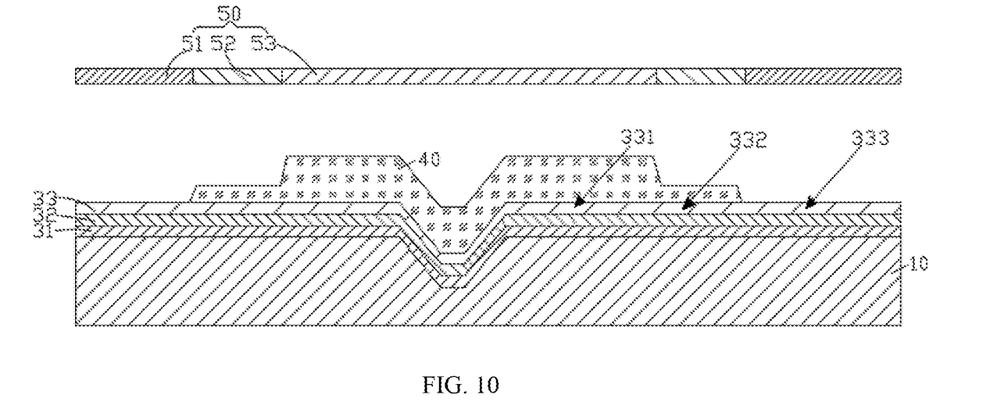

As shown in FIG. 10, the photoresist layer is patterned. A first photoresist region 331, a second photoresist region 332 and a photoresist-free region 333 are formed on the second transparent conductive layer 33 in parallel. Along the stacking direction of the electrode layer 30, an orthographic projection of the first transparent conductive layer 31 (as shown in FIG. 4) coincides with an orthographic projection of a sum of the first photoresist region 331 and the second photoresist region 332, and an orthographic projection of each of the light-shielding conductive layer 32 and the second transparent conductive layer 33 (as shown in FIG. 4) coincides with an orthographic projection of the first photoresist region 331.

The photoresist layer is patterned through an exposure and development process using a semi light-transmissive mask 50. The semi light-transmissive mask 50 includes a fully light-transmissive region 51, a semi light-transmissive region 52 and an optically opaque region 53. A transparency of the semi light-transmissive region 52 is greater than a transparency of the optically opaque region 53 but less than a transparency of the fully light-transmissive region 51. The first photoresist region 331 is formed below the optically opaque region 53, that is, the orthographic projection of the first photoresist region 331 coincides with an orthographic projection of the optically opaque region 53; the second photoresist region 332 is formed below the semi light-transmissive region 52, that is, the orthographic projection of the second photoresist region 332 coincides with an orthographic projection of the semi light-transmissive region 52; and the photoresist-free region 333 is formed below fully light-transmissive region 51, that is, an orthographic projection of the photoresist-free region 333 coincides with an orthographic projection of the fully light-transmissive region 51.

Herein, a thickness of a photoresist layer on a surface of the second photoresist region 332 is smaller than a thickness of a photoresist layer on a surface of the first photoresist region 331.

Figure 11:
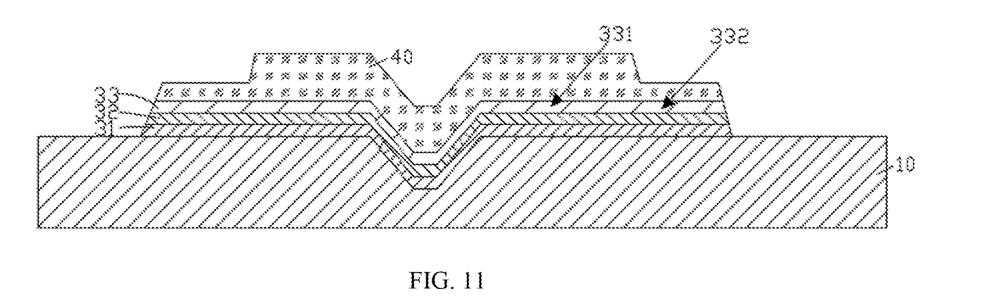

As shown in FIG. 11, the first transparent conductive layer 31, the light-shielding conductive layer 32 and the second transparent conductive layer 33 in the photoresist-free region are removed.

The first transparent conductive layer 31 and the second transparent conductive layer 33 are etched using an oxalic acid etching solution. The light-shielding conductive layer 32 is etched using a mixed acid etching solution of $HNO_3$, $CH_3COOH$, and $H_3PO_4$.

Figure 12:
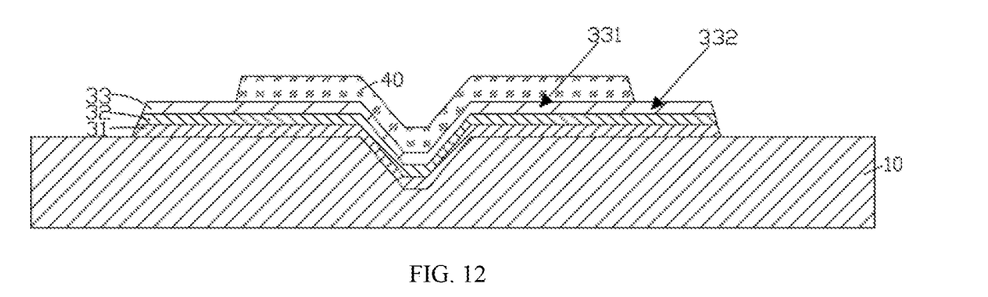

As shown in FIG. 12, the photoresist layer on the surface of the second photoresist region 332 is removed.

A reaction is carried out by using $SF_6+O_2$ gas through a dry ashing process to remove the photoresist layer 40 on the surface of the first photoresist region 331. In addition, a photoresist layer 40 on the surface of the second photoresist region 332 also reacts and decreases, resulting in a decrease in the thickness of the photoresist layer 40 on the surface of the second photoresist region 333.

Figure 13:
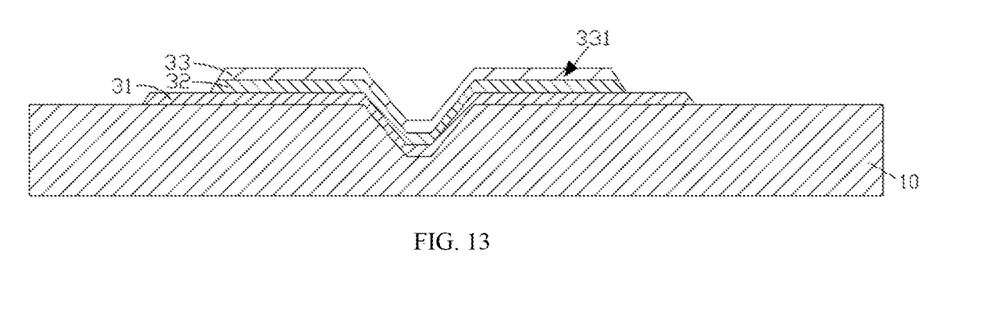

As shown in FIG. 13, the light-shielding conductive layer 32 and the second transparent conductive layer 33 in the second photoresist region are removed, and the photoresist layer on the surface of the first photoresist region 331 is removed.

In this step, the second transparent conductive layer and the light-shielding conductive layer which are not shielded by the photoresist layer are removed by a two-step wet etching.

The second transparent conductive layer 33 is etched using the oxalic acid etching solution. The light-shielding conductive layer 32 is etched using the mixed acid etching solution of $HNO_3$, $CH_3COOH$, and $H_3PO_4$.

The photoresist layer on the surface of the second photoresist region is removed by the dry ashing process.

In S803, a pixel defining layer is formed on the electrode layer.

Since S801 and S803 in this embodiment are substantially the same as S701 and S703 in the forgoing embodiment, the specific content of the forgoing embodiment may be specifically referred to, which is not repeated here.

It is not difficult to find that this embodiment is an embodiment of the method for producing the display panel corresponding to the embodiments mentioned above, and this embodiment may be implemented in cooperation with the embodiments mentioned above. The relevant technical details mentioned in the above-mentioned embodiments are still valid in this embodiment, and in order to reduce repetition, they will not be repeated here. Correspondingly, the relevant technical details mentioned in this embodiment may also be applied in the above-mentioned embodiments.

Compared with the existing technology, the display panel prepared by the method for producing the display panel provided by the embodiment of the present disclosure, by proposing a new method or solution of an anodereticle mask, achieves an effect of increasing an area of the anode, where an increased area of the anode area is a transparent ITO or IZO film which has almost no influence on a light transmittance of a screen body, and fundamentally preventing the pixel defining layer from being unable to completely cover the anode, so as to meet a process limit demand that an under-screen fingerprint identification technology is widely used in a display panel product without adding an extra reticle.

Those skilled in the art should appreciate that the aforementioned embodiments are specific embodiments for implementing the present disclosure. In practice, however, various changes may be made in the forms and details of the specific embodiments without departing from the spirit and scope of the present disclosure.

What is claimed is:

1. A display panel, comprising:
    a substrate;
    a pixel defining layer disposed on the substrate; and
    an electrode layer located between the substrate and the pixel defining layer;
    wherein the pixel defining layer is provided with a through hole disposed through the pixel defining layer to the electrode layer; the electrode layer comprises a first transparent conductive layer, a second transparent conductive layer, and a light-shielding conductive layer that are arranged in a stack, the first transparent conductive layer is sandwiched between the substrate and the light-shielding conductive layer, the light-shielding conductive layer is sandwiched between the first transparent conductive layer and the second transparent conductive layer, and along a stacking direction of the electrode layer, an area of an orthographic projection of the first transparent conductive layer on the substrate is larger than an area of an orthographic projection of the light-shielding conductive layer on the substrate.

2. The display panel according to claim 1, wherein along the stacking direction of the electrode layer, the orthographic projection of the light-shielding conductive layer on the substrate is located inside the orthographic projection of the first transparent conductive layer on the substrate.

3. The display panel according to claim 1, wherein along the stacking direction of the electrode layer, the orthographic projection of the light-shielding conductive layer on the substrate partially overlaps with the orthographic projection of the first transparent conductive layer on the substrate.

4. The display panel according to claim 1, wherein the first transparent conductive layer is located on a surface of the light-shielding conductive layer facing the substrate.

5. The display panel according to claim 1, wherein the light-shielding conductive layer is located on a surface of the first transparent conductive layer facing the second transparent conductive layer, and the light-shielding conductive layer is located on a surface of the second transparent conductive layer facing the first transparent conductive layer.

6. The display panel according to claim 1, wherein a lower edge of a first portion of a sidewall of the through hole reaches the first transparent conductive layer.

7. The display panel according to claim 6, wherein a lower edge of a second portion of the sidewall of the through hole reaches the second transparent conductive layer, the orthographic projection of the light-shielding conductive layer on the substrate partially overlaps with an orthographic projection of the second transparent conductive layer on the substrate, and the orthographic projection of the light-shielding conductive layer on the substrate is located inside the orthographic projection of the first transparent conductive layer on the substrate.

8. The display panel according to claim 6, wherein an edge of a third portion of the sidewall of the through hole is located on the light-shielding conductive layer.

9. The display panel according to claim 8, wherein a lower edge of a second portion of the sidewall of the through hole reaches the second transparent conductive layer, an orthographic projection of the second transparent conductive layer on the substrate is located inside the orthographic projection of the light-shielding conductive layer on the substrate, and the orthographic projection of the light-shielding conductive layer on the substrate is located inside the orthographic projection of the first transparent conductive layer on the substrate.

10. The display panel according to claim 6, wherein a lower edge of a second portion of the sidewall of the through hole reaches the second transparent conductive layer.

11. The display panel according to claim 10, wherein the second transparent conductive layer completely covers an upper surface of the light-shielding conductive layer facing the second transparent conductive layer and a side surface of the light-shielding conductive layer, and the orthographic projection of the light-shielding conductive layer on the substrate is located inside the orthographic projection of the first transparent conductive layer on the substrate.

12. The display panel according to claim 1, wherein a material of the first transparent conductive layer is ITO or IZO, a material of the second transparent conductive layer is ITO or IZO, and a material of the light-shielding conductive layer is a metal or a graphite.

13. The display panel according to claim 1, wherein a thickness of the first transparent conductive layer and a thickness of the second transparent conductive layer are both greater than or equal to 8 nm and less than or equal to 15 nm.

14. The display panel according to claim 1, wherein a thickness of the light-shielding conductive layer is greater than or equal to 80 nm and less than or equal to 120 nm.

15. A display device, comprising the display panel according to claim 1.

16. The display panel according to claim 1, wherein the second transparent conductive layer completely covers an upper surface of the light-shielding conductive layer facing the second transparent conductive layer and a side surface of the light-shielding conductive layer, and the orthographic projection of the light-shielding conductive layer on the substrate is located inside the orthographic projection of the first transparent conductive layer on the substrate.

* * * * *